(12) United States Patent
Campbell et al.

(10) Patent No.: US 7,314,781 B2
(45) Date of Patent: Jan. 1, 2008

(54) DEVICE PACKAGES HAVING STABLE WIREBONDS

(75) Inventors: Brett J. Campbell, Hatfield, PA (US); Patrick J. Carberry, Laury's Station, PA (US); Jason P. Goodelle, Allentown, PA (US); Michael Francis Quinn, Allentown, PA (US)

(73) Assignee: LSI Corporation, Milpitas, CA (US)

( * ) Notice: Subject to any disclaimer, the term of this patent is extended or adjusted under 35 U.S.C. 154(b) by 606 days.

(21) Appl. No.: 10/702,875

(22) Filed: Nov. 5, 2003

(65) Prior Publication Data

US 2006/0172456 A1 Aug. 3, 2006

(51) Int. Cl.
*H01L 21/60* (2006.01)

(52) U.S. Cl. .................. 438/111; 438/123; 438/466; 438/617; 257/E23.025

(58) Field of Classification Search .......... 438/111, 438/112, 123, 466, 617, FOR. 366, FOR. 367, 438/FOR. 377, FOR. 380, 517; 257/E23.025
See application file for complete search history.

(56) References Cited

U.S. PATENT DOCUMENTS

| | | | | |
|---|---|---|---|---|
| 4,845,543 A | * | 7/1989 | Okikawa et al. | 257/738 |
| 4,912,544 A | * | 3/1990 | Onuki et al. | 257/771 |
| 4,936,925 A | * | 6/1990 | Watanabe et al. | 148/621 |
| 5,090,119 A | * | 2/1992 | Tsuda et al. | 29/843 |
| 5,153,704 A | * | 10/1992 | Onuki et al. | 257/784 |
| RE34,641 E | * | 6/1994 | Kamada et al. | 148/684 |
| 5,527,742 A | | 6/1996 | Weiler et al. | 437/211 |
| 5,637,274 A | * | 6/1997 | Kitamura | 420/463 |
| 5,658,664 A | * | 8/1997 | Uno et al. | 428/364 |
| 5,966,592 A | * | 10/1999 | Beroz et al. | 438/111 |
| 6,232,211 B1 | * | 5/2001 | Tsukahara | 438/612 |
| 2002/0076911 A1 | * | 6/2002 | Lin | 438/613 |
| 2004/0191954 A1 | * | 9/2004 | Ano | 438/106 |

OTHER PUBLICATIONS

X. Zhang et al., *Excimer laser ablation* ..., Appl. Phys. A, vol. 64, pp. 545-552 (1997).

* cited by examiner

*Primary Examiner*—George Fourson

(57) ABSTRACT

A method of making a packaged electrical device comprises the steps of (a) connecting one end of a wire to a first point (e.g., a first electrical node) in the package, and (b) connecting the other end of the wire to a second point (e.g., a second electrical node) in the package, characterized by (c) causing energy from an external source to heat at least one predetermined segment of the wire to a temperature that is below its melting point (MP) but not below its recrystallization temperature (RCT), and (d) cooling the heated segment to a temperature below its RCT [e.g., to room temperature (RT)], thereby to increase the stiffness modulus of the segment. In one embodiment, the external source is a laser whose optical output is absorbed by the segment. In another embodiment, the heated segment is rapidly cooled (i.e., quenched) to RT. In an embodiment suitable for use with IC chips that have a multiplicity of side-by-side wirebonds, apparatus for heating and cooling the segments and/or the IC chips is located on an x-y table, which allows the wirebonds and the apparatus to be scanned sequentially relative to one another. By increasing the stiffness of at least one segment of each wire, our process increases the physical stability of all of the wires and thereby enables finer wires to be utilized in the fabrication of high-density I/O packaged devices.

10 Claims, 1 Drawing Sheet

DEVICE PACKAGES HAVING STABLE WIREBONDS

BACKGROUND OF THE INVENTION

1. Field of the Invention

This invention relates to the fabrication of wirebonds to electrical devices (including optoelectronic devices), and, more particularly to the fabrication of wirebonds to integrated circuits (ICs).

2. Discussion of the Related Art

The fabrication of electrical semiconductor devices or chips typically begins with front-end processing, which may include one or more of the following steps: epitaxial growth of semiconductor layers on a wafer or substrate, photolithographically patterning the layers and/or the substrate, doping the layers and/or the substrate to form various device regions, depositing and shaping dielectric layers, depositing and shaping electrical conductors and/or bond pads, and dicing the wafer into individual devices or chips. Subsequently, the devices undergo back-end processing, which may include forming wirebonds to the bond pads, encapsulating the wirebonds and devices in an electrically insulating material, and packaging the devices in suitable ceramic, plastic or metal containers.

In the IC industry, a multiplicity of side-by-side wirebonds is often formed along the edges of each IC chip by means of a wire-bonding machine (e.g., a ball-bonding or wedge-bonding machine). The number of wirebonds is related to the number of input/output (I/O) signals that a particular IC is required to accommodate. As the number of I/Os increases for a particular chip size (i.e., as the lead count increases), the diameter of each wirebond must decrease (e.g., from 1 mil to 0.5 mil) in order to maintain sufficient spacing between them. But finer (i.e., thinner) wirebonds are physically less stable, especially during the encapsulation process when the injected encapsulant may displace one or more of them (known as wire sweep) sufficiently to cause adjacent wirebonds to contact one another and thereby form an undesirable short circuit.

One solution to this problem might be to change the encapsulant to a material that causes less wire sweep during the encapsulating (i.e., molding) process of finer wirebonds. Unfortunately, changing the encapsulant implies increasing cost, which is undesirable in the cost-sensitive, highly competitive IC industry.

Another solution, is to coat the wires with insulative material before encapsulation, as described by P. M. Weiler et al., in U.S. Pat. No. 5,527,742 issued on Jun. 18, 1996, but this approach suffers from cross-talk problems because the way that insulated wires cross one another differs from one chip to another. This patent is incorporated herein by reference.

Thus, a need remains in the art for a process that enables high-density, small-diameter wirebonds to be formed with less wire sweep and without having to utilize expensive encapsulants or having to insulate the wires first.

BRIEF SUMMARY OF THE INVENTION

In accordance with one aspect of our invention, a method of making a packaged electrical device comprises the steps of (a) connecting one end of a wire to a first point (e.g., a first electrical node) in the package, and (b) connecting the other end of the wire to a second point (e.g., a second electrical node) in the package, characterized by (c) causing energy from an external source to heat at least one predetermined segment of the wire to a temperature that is below its melting point (MP) but not below its recrystallization temperature (RCT), and (d) cooling the heated segment to a temperature below its RCT [e.g., to room temperature (RT)], thereby to increase the stiffness modulus of the segment. In one embodiment, the external source is a laser whose optical output is absorbed by the segment. In another embodiment, the heated segment is rapidly cooled (i.e., quenched) to RT. In an embodiment suitable for use with IC chips that have a multiplicity of side-by-side wirebonds, apparatus for heating and cooling the segments and/or the IC chips is located on an x-y table, which allows the wirebonds and the apparatus to be scanned sequentially relative to one another.

By increasing the stiffness of at least one segment of each wire, our process increases the physical stability of all of the wires and thereby enables finer wires to be utilized in the fabrication of high-density I/O packaged devices.

This process may be employed when making wirebonds from one device to another (e.g., from one IC to another) within the package or from a device to the wall or other portion of the package itself.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

Figure 2:
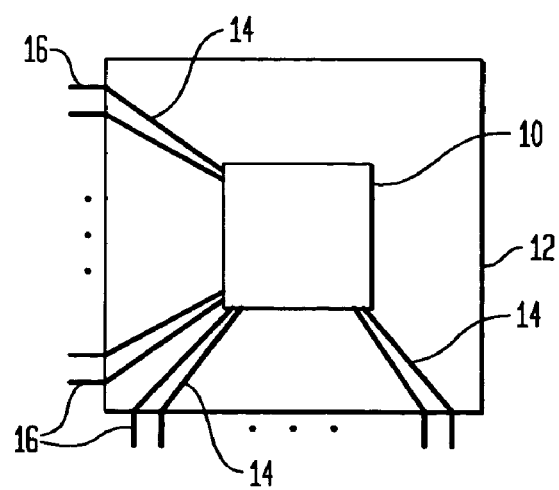
FIG. 2 is a schematic, top view of a high-density lead frame showing a multiplicity of wirebonds connected between I/O ports on a chip and an array of connectors.

Although our invention may be utilized to increase the stiffness of a single wirebond that connects first and second electrical nodes of a packaged electrical device, its immediate application is in the IC industry where, as shown in FIG. 2, a multiplicity of side-by-side wires 14 is often connected between connectors 16 and I/Os located along the edges of each IC chip 10. This interconnection process is typically performed by means of a wire-bonding machine. Consequently, we describe below various embodiments of our invention that are particularly well-suited to such IC applications and, in part, to decreasing the likelihood that wire sweep will cause an undesirable short circuit during the IC encapsulation process. Our invention, however, is not limited to such IC embodiments.

General IC Fabrication Process

After the completion of front-end processing, an IC wafer, which often contains thousands of IC chips, is subjected to a plurality of process steps known as back-end processing. As described briefly earlier, back-end processing may include the following well-known steps: (1) forming wirebonds between pairs of electrical nodes (e.g., between chips and bond pads; between different chips; or between chips and package walls), (2) encapsulating the wirebonds and the chips in electrically insulating material, and (3) packaging the chips in suitable ceramic, plastic or metal containers. In the IC art some of these types of wirebond connections are formed by well-known processes such as chip-scale-packaging and up-bonding.

Once the wires 14 are bonded to I/Os of chip 10 and to, for example, the connectors 16 of a lead frame 12, and before encapsulation, they are visually inspected to determine if any wires are shorted to one another. At this stage, short circuits can be obviated by simply moving wires that touch one another until they no longer touch.

Each chip is then mounted in a heated mold and a commercially available thermal plastic is injected into the mold. The plastic flows between the wires and in some cases may cause adjacent wires to touch one another, thereby forming undesirable short circuits (i.e., the wire sweep problem mentioned earlier). The assembly, including the plastic, is allowed to cool to RT, typically in an atmosphere of air. After the plastic solidifies, the encapsulated chips are removed from the molds. At this stage the encapsulated chips are typically x-rayed to check for wire sweep; in particular, to identify and discard any chips with short circuits in the wirebonds.

Those chips that pass the x-ray inspection (i.e., those exhibiting no short circuits) are then subjected to further processing to complete the package; e.g., de-flashing to remove excess plastic from the surface and/or edges of the encapsulated chip, and lead-forming to shape the leads into J-bends or gull wings.

Preferred Embodiments

Figure 1:
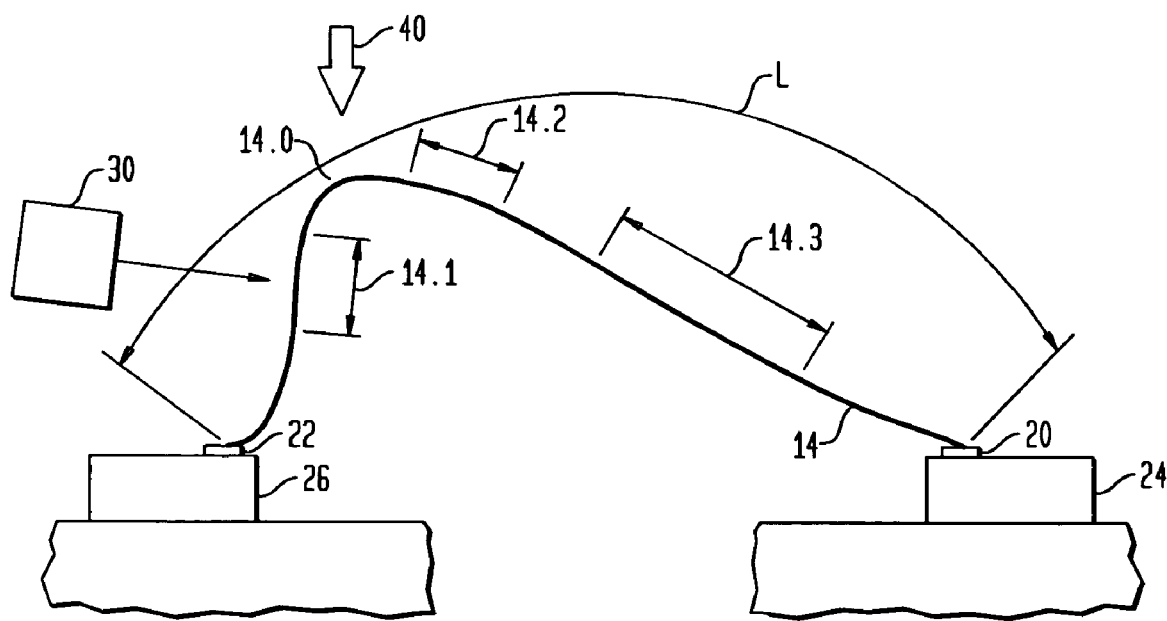
FIG. 1 is a schematic, side view demonstrating how two points (e.g., electrical nodes on two chips) in a package are electrically interconnected by means of a wirebond in accordance with one embodiment of our invention.

In accordance with one aspect of our invention, the likelihood of wire sweep resulting in short circuits is significantly reduced by increasing the stiffness modulus (measured in pascals) of at least a segment of each of the wires. As shown in FIG. 1, wire 14 is connected between electrical nodes 20 and 22, which are illustratively depicted as being located on separate IC chips 24 and 26, respectively. In practice, nodes 20 and 22 may be, for example, ball bonds or wedge bonds; that is, the placement of the wire 14 and the formation of nodes 20 and 22 is typically accomplished by means of a conventional wire-bonding machine.

In order to increase the stiffness of wire 14 it is not necessary to increase the stiffness along its entire length L. Rather, it is sufficient to increase the stiffness modulus of at least one segment (e.g., 14.1) of length shorter than L, or of several such segments (e.g., 14.1, 14.2 and/or 14.3) such that the total length of all of the segments is less than L. The location of the segments depends on the particular application. In general, the segment locations are chosen to maintain the wire shape stability during any subsequent process steps that apply pressure to the wire (e.g., during encapsulation, which forces an encapsulant onto the wires in the direction of arrow 40 shown in FIG. 1). Typically the segments are located at or near bends created when a wire-bonding machine manipulates the wire 14 during the wire-bonding process. The heat annealing increase the stiffness of the wire in these area, which are already work hardened during the wire bonding process.

For example, in some cases the segment (e.g., 14.1) is preferably located near the apex 14.0 but closer to node 22, whereas in other cases a segment (e.g., 14.2) is located near apex 14.0 but closer to node 20. Alternatively, a segment (e.g., 14.3) may be located more remote from apex 14.0.

In any case, to increase the stiffness modulus of a particular segment, an external source of energy heats the segment (e.g., 14.1) to a particular temperature (or range of such temperatures) that is below its MP but not below its RCT, both of which are dependent on the wire material. The particular temperature may vary in time within that range, which depends on the volume of the segment selected for heating and/or the amount of heat that is needed for a particular application. Then, the heated segment is cooled to a temperature below its RCT, typically to RT.

Preferably, the source of heat is a laser 30 whose output is focused on the segment and is absorbed by the segment material. In this case, the heated volume depends on the surface area illuminated by the laser, the penetration depth of the laser radiation, and the conduction of heat out of the illuminated region. Other heating sources may also be suitable; e.g., magnetic, electrical or acoustic, provided in any case that the IC chip is not damaged in the heating process. (Localized heating of a segment rather than the entire wire is advantageous in this regard.) The segment should be held at the particular temperature above the RCT of the wire material for a time period sufficient to erase the effects of previous heating steps and to activate the hardening/stiffening mechanism. In addition, the duration of the time period is a function of the material of the wire, the volume of wire material being heated, and the power of the heating source. Time periods in the range of a few seconds to tens of minutes are suitable.

The heated segment may be cooled gradually to a temperature below its RCT (e.g., to RT), or it may be quenched (depending on desired effect). In addition, the heating-cooling sequence may be repeated for each segment. Quenching (fast cooling) is preferred since it tends to lock in the metallurgical state brought about by heat treatment at the appropriate temperature, thus imparting the desired mechanical properties at the lower temperature (e.g, at RT). The mechanism for hardening/stiffening will depend on the materials used for the segment and the heating cooling regimen used. The mechanisms can range from the formation of precipitates or substituted crystalline structures that limit mobility within the material (thereby hardening or stiffening) to formation of harder or stiffer microstructure.

Illustratively, the heated segment may be cooled gradually by blowing cool air over it, or it may quenched by flowing a cryogenic fluid (e.g., liquid nitrogen) over it to control the formation of the hardening/stiffening mechanism.

The length of a segment relative to the total L of a particular wire may be empirically determined, but a segment length that is about 5% of L is suitable. Illustratively, wirebonds are about 3-5 mm (3000-5000 µm) long, and the segments are about 150-250 µm long.

The trend of the IC industry is to increase the I/O density and hence to use smaller diameter wires. Today a 1 mil (25 µm) diameter is typical, but soon 0.5 mil (12.5 µm) wires are expected to be prevalent. But, for a given wire material, smaller diameter wires are more prone to wire sweep and hence would be more in need of a remedial measure of the type afforded by our invention.

Typically IC wires are made of Au predominantly; e.g., 4-9's pure Au or an alloy of 2-9's pure Au and 1% Pd. In the case of pure Au the MP is about 500° C. and its RCT is about 365° C. (In general, the RCT is about 73% of the MP.) Thus, a Au segment (e.g., 1 mil in diameter and 200 µm long) could be heated by means of a KrF laser using a power of less than about 0.5 J/cm$^{-2}$. Such a laser is described by X. Zhang et al. in *J. Appl. Phys. A*, Vol. 64, pp. 545-552 (1997), which is incorporated herein by reference. Alternatively, the wires may be made of other metals such as, for example, Al or Cu.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, the heating-cooling sequence for increasing stiffness may occur after at least one end of the wire is affixed (e.g., bonded) to the chip or package, or it may occur after both ends of the wire affixed. In addition, depending on the ability to focus the energy of the heating and/or cooling sources, it may be desirable to treat a subset or group (i.e., two or more) of wires simultaneously, thereby saving processing time.

We claim:

1. A method of making a packaged electrical device comprising the steps of:
    a. connecting one end of a wire to a first electrical node in the package; and
    b. connecting another end of the wire to a second electrical node in the package; characterized by, after step (b) performing the following steps:
    c. causing energy from an external source to heat at least one predetermined segment of the wire to a temperature below the melting point of the wire but not below its recrystallization temperature, the total length of said segment(s) being less than the length of said wire between said ends, and
    d. cooling the heated segment to a temperature below the recrystallization temperature, thereby to increase the stiffness modulus of that segment.

2. The method of claim 1, wherein the heated segment is cooled gradually by blowing air over the segment.

3. The method of claim 1, wherein the heated segment is cooled by a quenching process that includes flowing a cryogenic fluid over the segment.

4. The method of claim 1, wherein the external source applies to the segment energy selected from the group consisting of optical, acoustic, magnetic and electrical energy.

5. The method of claim 4, wherein the external source applies to the segment optical energy in the form of a laser beam that is absorbed by the segment.

6. The method of claim 1, wherein steps (a) and (b) are repeated to form a multiplicity of wires interconnecting electrical nodes in the package, and wherein steps (c) and (d) are performed on a plurality of the wires one at a time.

7. The method of claim 1, wherein steps (a) and (b) are repeated to form a multiplicity of wires interconnecting electrical nodes in the package, and wherein steps (c) and (d) are each performed simultaneously on wires within a subset of the multiplicity.

8. The method of claim 1, wherein steps (c) and (d) are repeated for the at least one predetermined segment.

9. A method of making an IC package having a multiplicity of wires interconnecting at least one IC chip with the package and/or other IC chips in the package, each of the wires being connected to electrical nodes and stiffened in accordance with the method of claim 1, and further including, after step (d), the additional step of (e) encapsulating the chips and the wires in an electrically insulating material.

10. The method of claim 1, wherein said wire has an apex between said ends and said at least one segment is located closer to said apex than to either of said ends.

* * * * *